United States Patent [19]

Arai et al.

[11] Patent Number: 4,706,187
[45] Date of Patent: Nov. 10, 1987

[54] METHOD OF AND APPARATUS FOR PREPARING NUMERICAL CONTROL DATA FOR INSERTING COMPONENTS

[75] Inventors: Yoshinao Arai; Shino Takahashi, both of Yokohama; Eigo Oikawa, Katsuta; Shigeru Sato; Hideaki Kobayashi, both of Yokohama, all of Japan

[73] Assignee: Hitachi, Ltd., Tokyo, Japan

[21] Appl. No.: 787,928

[22] Filed: Oct. 16, 1985

[30] Foreign Application Priority Data

Feb. 22, 1985 [JP] Japan .................................. 60-32875

[51] Int. Cl.$^4$ ............................................. H05K 3/30
[52] U.S. Cl. .................................... 364/191; 364/468; 364/491; 361/400; 29/710; 29/740; 29/741
[58] Field of Search ............... 364/468, 191, 192, 189, 364/491, 488–490; 318/640; 29/739, 740, 741, 710; 361/400

[56] References Cited

U.S. PATENT DOCUMENTS 4,513,366  4/1985  Munekata ............................ 364/191
4,566,071  1/1986  Takahashi ........................... 364/468

Primary Examiner—Jerry Smith
Assistant Examiner—Allen MacDonald
Attorney, Agent, or Firm—Antonelli, Terry & Wands

[57] ABSTRACT

The present invention relates to a computer system which can store assembly information and component information for components to be automatically inserted by an insertion machine into a printed board, which can perform required operations based upon the information stored, and which can display and output results of the processings. In the present method, the system checks for possible mechanical interference, when inserting a component, between an insertion head and other components having the possibility to be inserted prior to the component prepares preceding relations of insertion order from the results of an interference checking, selects the components which cannot be inserted automatically according to the preceding relations of insertion order, and modifies insertion processes or insertion directions thereof, decides insertion order of the components according to the modified insertion processes or the insertion directions, and, at last, automatically prepares and outputs numerical control data relating to the automatic insertion of said components.

9 Claims, 32 Drawing Figures

| COMPONENT NAME | INSERTION PROCESS DIVISION | COMPONENT SIZE | | | POLARITY | |
|---|---|---|---|---|---|---|
| | | LENGTH | WIDTH | HEIGHT | | |
| J 01467 | 2 | 5.6 | 15.6 | 4.8 | WITHOUT POLARITY | ~38 |
| J 21358 | 2 | 6.3 | 15.6 | 3.6 | WITHOUT POLARITY | ~39 |
| K 00408 | 3 | 4.0 | 8.0 | 7.2 | WITH POLARITY | ~40 |
| D 37251 | 1 | 10.6 | 25.0 | 4.8 | WITH POLARITY | ~41 |

FIG. 2

10 BOARD INFORMATION RECORD — 11 BOARD NAME, 12 BOARD SIZE ON X CO-ORDINATE, 13 BOARD SIZE ON Y CO-ORDINATE

20 COMPONENT RECORD — 21 COMPONENT NAME, 22 INSERTION POSITION ON X CO-ORDINATE, 23 INSERTION POSITION ON Y CO-ORDINATE, 24 COMPONENT SIZE, 25 INSERTION DIRECTION, 26 INSERTION PROCESS, 27 INSERTION ORDER

| P 7055138 | 240.0 | 180.0 | | | |
|---|---|---|---|---|---|
| J 21358 | 10.0 | 38.0 | 17.5 | 90° | — | — |
| K00408 | 25.5 | 34.0 | 10.0 | 0° | — | — |
| J 23716 | 20.5 | 16.0 | 12.5 | 0° | — | — |
| D40096 | 10.0 | 120.0 | — | 180° | — | — |
| | | | | 270° | — | — |

FIG. 3

| 31 COMPONENT NAME | 32 INSERTION PROCESS DIVISION | 35 LENGTH | 33 WIDTH | 36 HEIGHT | 34 POLARITY | |
|---|---|---|---|---|---|---|
| J 01467 | 2 | 5.6 | 15.6 | 4.8 | WITHOUT POLARITY | ~38 |
| J 21358 | 2 | 6.3 | 15.6 | 3.6 | WITHOUT POLARITY | ~39 |
| K 00408 | 3 | 4.0 | 8.0 | 7.2 | WITH POLARITY | ~40 |
| D 37251 | 1 | 10.6 | 25.0 | 4.8 | WITH POLARITY | ~41 |

(Column 33 = COMPONENT SIZE header spanning 35 LENGTH, 37 WIDTH, 36 HEIGHT)

FIG. 8
| COMPONENT | PROCESS | INSERTABLE DIRECTION | |
|---|---|---|---|
| ① | 1 | II | |
| ② | 1 | I | |
| ③ | 1 | II | |
| ④ | 2 | II | IV |
| ⑤ | 2 | I | |
| ⑥ | 2 | II | IV |
| ⑦ | 2 | I | III |
| ⑧ | 2 | I | III |
| ⑨ | 2 | III | |
| ⑩ | 2 | I | III |
| ⑪ | 2 | I | |
| ⑫ | 2 | II | IV |
| ⑬ | 2 | III | |
| ⑭ | 2 | I | III |
| ⑮ | 2 | II | |
FIG. 9
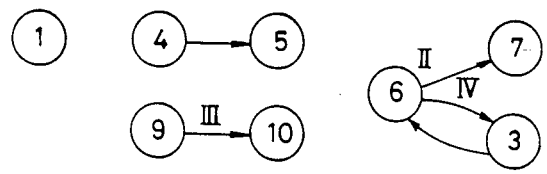
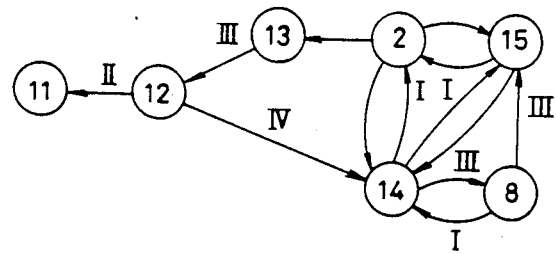

STRONGLY CONNECTED COMPONENTS

| FROM\TO | P1 | P2 | P3 | P4 | P5 |
|---|---|---|---|---|---|
| P1 | 0 | 14 | 30 | 14 | 36 |
| P2 | 14 | 0 | 20 | 20 | 22 |
| P3 | 30 | 20 | 0 | 28 | 10 |
| P4 | 14 | 20 | 28 | 0 | 36 |
| P5 | 36 | 22 | 10 | 36 | 0 |

P1 ⟶ P3

P2 ⟶ P1

P2 ⟶ P5

P7 → P2
P6 → P9

| FROM \ TO | P1 | P2 | P3 | P4 | P5 | P6 | P7 | P8 | P9 |
|---|---|---|---|---|---|---|---|---|---|
| P1 | 0 | 14 | 22 | 58 | 50 | 36 | 20 | 22 | 36 |
| P2 | 14 | 0 | 10 | 45 | 36 | 22 | 11 | 30 | 22 |
| P3 | 22 | 10 | 0 | 41 | 31 | 14 | 18 | 40 | 20 |
| P4 | 58 | 45 | 41 | 0 | 10 | 30 | 39 | 64 | 23 |
| P5 | 50 | 36 | 31 | 10 | 0 | 20 | 32 | 58 | 14 |
| P6 | 36 | 22 | 14 | 30 | 20 | 0 | 25 | 51 | 14 |
| P7 | 20 | 11 | 18 | 39 | 32 | 25 | 0 | 27 | 18 |
| P8 | 22 | 30 | 40 | 64 | 58 | 51 | 27 | 0 | 44 |
| P9 | 36 | 22 | 20 | 23 | 14 | 14 | 18 | 44 | 0 |

METHOD OF AND APPARATUS FOR PREPARING NUMERICAL CONTROL DATA FOR INSERTING COMPONENTS

BACKGROUND OF THE INVENTION

1. Field of the Invention

The present invention relates to a method of and an apparatus for preparing numerical control data required by, for example, an automatic insertion machine for inserting electronic components.

2. Description of the Prior Art

Conventionally, numerical control (NC) data, which are required by an automatic insertion machine for inserting electronic components, have been prepared manually in most cases. In the prior art, at every insertion of a component mechanical interference (collision) is checked between the automatic insertion machine and components which are already inserted, while inserting components one after another by utilizing the automatic insertion machine. Thus, it is very troublesome with this method to prepare and check control data, and especially to modify data when there occurs an interference. Even when a computer is utilized for checking the interference, it is inevitable that the automatic insertion ratio (the ratio of components which can be automatically inserted by the machine to all components to be inserted) drops to some extent, as this system may check the inteference only when the components are inserted according to the predetermined insertion order.

SUMMARY OF THE INVENTION

The object of the present invention is to provide a method and an apparatus for preparing numerical control data for inserting components, which can improve the efficiency in preparing NC data for inserting components, realize high reliability for data prepared, and increase the automatic insertion ratio.

The above object of the present invention is attained by utilizing a computer system which can store assembly information and component information relating to components to be automatically inserted on a board by an automatic component insertion machine, which can execute required operations on the basis of the above information, and which can display and output the results of the operations. The present method comprises the steps of: checking possible mechanical interference when inserting a component between an insertion head and other components to be inserted by prior machines and by the same machine; preparing preceeding relations of the insertion order from the checking of results (interference checking), selecting components which are not possible to be inserted automatically on the basis of the preceding relations of insertion order so as to modify insertion processes or insertion directions thereof; deciding insertion order of the components on the basis of the insertion processes or insertion directions modified; and then, automatically preparing and outputting numerical control data for inserting the above components automatically.

The above steps of the present method will be described in detail as follows.

First, the computer system of the present invention checks possible mechanical interference, when inserting a component between an insertion head of an automatic insertion machine and other components which are to be inserted by the prior machines or other components which are to be inserted by the same machine, and then prepares preceding relations of an insertion order according to the results of the interference checking. For example, when a component i can not be inserted since a previously inserted component j interferes mechanically with the component i, the following preceding relation of insertion order is prepared for the components i and j:

Component i→Component j.

This preceding relation of insertion order means the component i should be inserted prior to the component j. Then, the computer system calculates component groups which can not be inserted in any insertion order from the preceding relations of insertion order which has been prepared. For example, when there are the preceding relations of insertion order such as Component i→Component j, Component j→Component K, and Component k→Component i, these components i, j, and, k constitute the uninsertable component group. Next, some attempt is made on some of the components included in the uninsertable component groups to change insertion processes or insertion directions thereof.

For example, when there are two components i and j which are to be inserted by the same machine, and there are the conflicting preceding relations of insertion order of Component i→Component j and Component j→Component i, the insertion process of the component i may be changed to manual insertion. By this operation, the component i will be inserted manually after all other components have been inserted, thus, the preceding relation of insertion order Component j→Component i is satisfied and the preceding relation Component i→Component j is eliminated, since the insertion process of the component i is changed to manual so that the space is no longer required for an insertion head to carry out insertion. Accordingly, the automatic insertion of the component j is possible.

Further, when a component without polarity, such as a resistor, is to be inserted, it is possible to reverse the insertion direction of the component. As the insertion head of the automatic insertion machine is rotatable in a 180-degree arc, the mechanical interference may possibly be avoided by inserting the component in the reverse direction. Through these attempts, the final preceeding relations of insertion order having no uninsertable component groups are prepared, and the insertion order is decided according to the above constraints.

With this structure and fundamentals, the present method will improve efficiency in preparing NC data for inserting components, attain high reliability for data prepared, and increase the automatic insertion ratio of components.

BRIEF DESCRIPTION OF THE DRAWINGS

FIG. 2 shows assembly information utilized in the present invention.

FIG. 3 shows component information utilized in the present invention.

FIG. 8 shows the relation between a insertion process and insertable directions for each component according to the present method.

FIG. 9 shows directed graphs illustrating preceding relations of insertion order for the example shown in FIG. 8.

DETAILED DESCRIPTION OF THE PREFERRED EMBODIMENT

The preferred embodiment of the present invention will be described hereinafter in accordance with the appended drawings.

Figure 1:
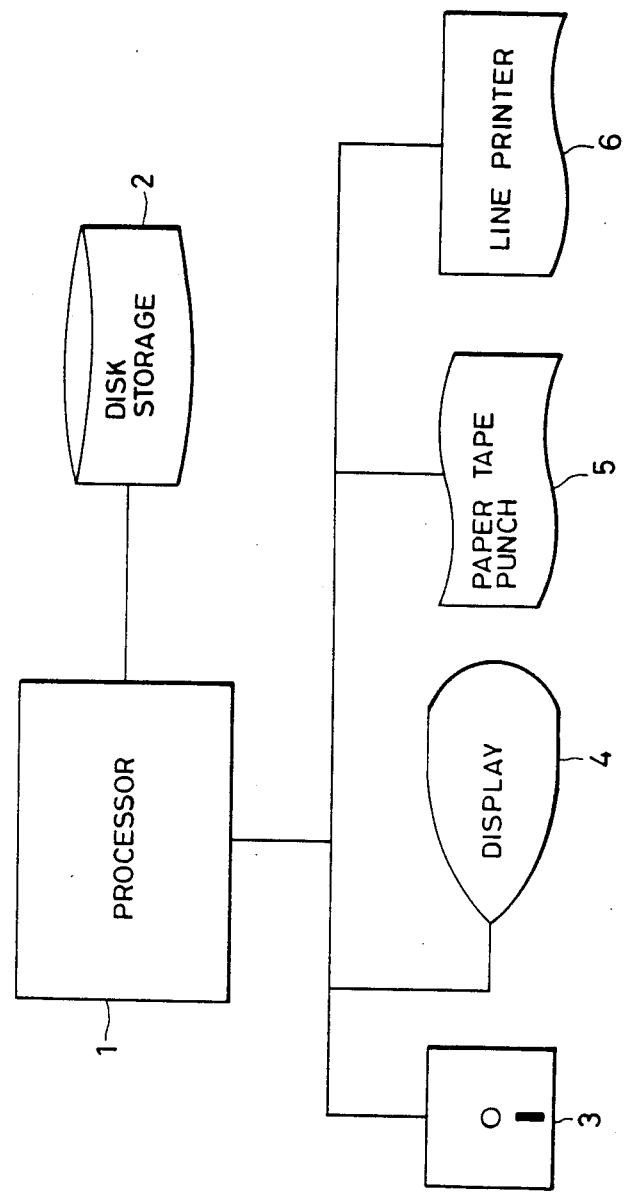
FIG. 1 is a block diagram showing a computer system utilized in the present invention.

FIG. 1 is a block diagram showing a computer system utilized in the embodiment of the present invention for preparing numerical control data for inserting components. In the figure, a processor 1 executes various operations according to the present invention. Connected to the processor 1 are a disk storage 2 for storing assembly and component information etc., a floppy disk drive 3 for inputting assembly information, a display 4 for entering component information and for displaying and modifying processing results, a paper tape punch 5 for outputting NC data for inserting components, and a line printer 6 for printing out processing results.

Firstly, assembly information and component information will be described in accordance with FIG. 2 and FIG. 3.

FIG. 2 shows the assembly information for an individual printed board consisting of a one board information record 10 and component records 20 of as many as components to be inserted on the board. Each component record 20 includes several data items indicating an electronic component name 21, insertion positions 22 and 23, an insertion direction 25, etc. This component record 20 is generally prepared by a CAD system (CAD=Computer Aided Design), and is entered into the present computer system through a floppy disk. The insertion position items 22 and 23 indicate X and Y coordinates of the reference point, which is predetermined for each kind of cómponent, on the printed board. The insertion direction item 25 indicates a rotational angle, when a component is rotated about the reference point from the reference direction predetermined for each component and inserted into a board. The component record 20 further includes data items indicating an insertion process 26 and an insertion order 27. These two data items 26 and 27 are not supplied with their values when they are prepared by the CAD.

The component information includes, as shown in FIG. 3, data items indicating a component name 31, an insertion process division 32, component size 33, and component polarity 34, for all components to be used by the system.

These data are stored within an assembly information file and a component information file, respectively, in the disk storage 2.

In the present method for preparing NC data for inserting components, the insertion processes and insertion order of the components are decided by the following procedure. Here, a process means a group of insertion operations carried out by one machine, for example, an IC component insertion process.

Figure 4:
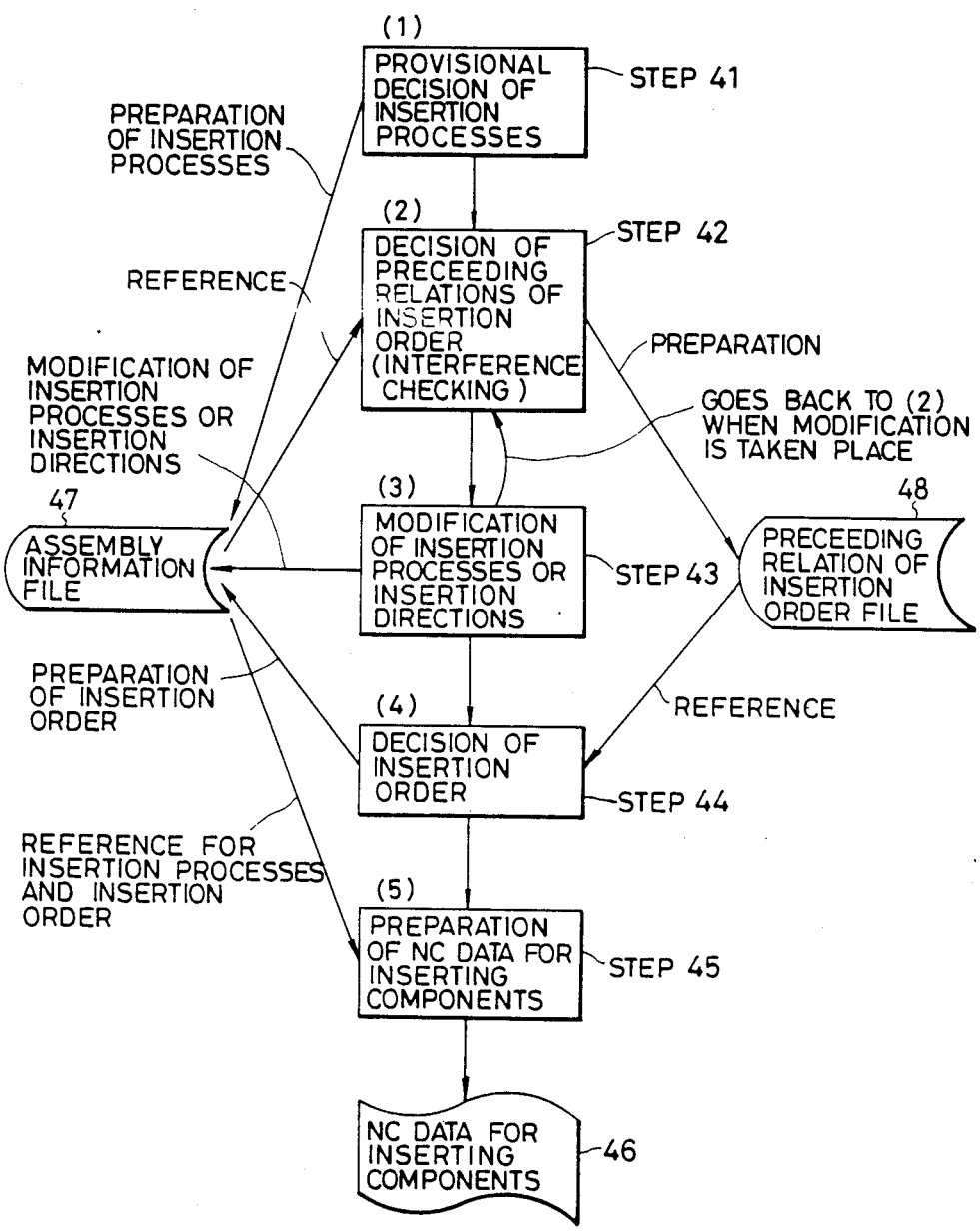
FIG. 4 shows the procedure for preparing numerical control data according to the present invention.

As shown in FIG. 4, the present method comprises five steps: (1) a provisional decision step of insertion processes (Step 41); (2) a decision step of preceding relations of insertion order (intereference checking) (Step 42); (3) a modification step of insertion processes and insertion directions (Step 43); (4) a decision step of insertion order (Step 44); and (5) a preparation step of NC data for inserting components (Step 45).

The function of these steps will be described, in turn, hereinafter in accordance with FIG. 4.

(1) A Provisional Decision Step of Insertion Processes (Step 41)

In this step, the component information file is searched utilizing the component information file is searched utilizing the component name 21 of each component record 20 in the assembly information as a key, then, an insertion process is decided provisionally according to the insertion process division 32 of each component, and this insertion process division is written in an insertion process data item 26 of each component record 20 in the assembly information. The insertion process division means a predetermined machine or a process assigned to each component for inserting the component when there is no mechanical interference. For example, if a board is assembled by four machines or proceeses in the order of an IC insertion machine, an axial lead component insertion machine, a radial lead component insertion machine, and manual insertion, the insertion process division 1 is assigned to the IC components, the insertion process division 2 is assigned to the axial lead components, and the insertion process division 3 is assigned to the radial components. The provisional insertion process decided for each component in this step may be modified in the step (3) (a modification step of insertion processes).

(2) A Decision Step of Preceding Relations of Insertion Order (Interference Checking) (Step 42)

Here, "interference" means possible mechanical interference between the insertion head of the insertion machine and other components already inserted when inserting a component automatically. Further, the preceding relation of insertion order means the condition relating to the insertion order of two components i and j. The preceding relation of insertion order (Component i→Component j) indicates that the component i should be inserted prior to the component j, as the component j interferes with the insertion head of the insertion machine when the component i is inserted if the component j is inserted prior to the component i.

Although mechanical interference may be checked by various methods, one simple method will be explained in the following description.

The fundamental concept of interference checking of the present invention is that the possible interference can be detected by expressing a region required for the insertion head of the automatic insertion machine to insert a specific component (an insertion operation space) and regions occupied by components (component regions) as simple plain figures (for example, rectangle, circle, etc.). and by checking the overlapping of these figures.

Figure 5A:
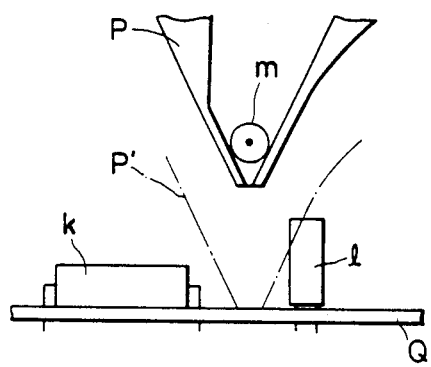
FIGS. 5(a) and (b) illustrates the interference checking of the present invention, which is possibly generated when inserting a component.
Figure 5B:
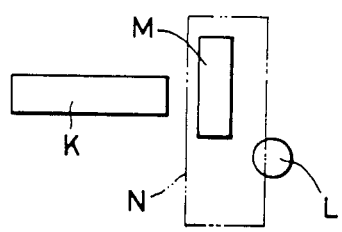

FIG. 5 illustrates the checking for interference, which may be generated when inserting a component, according to the present method. In FIG. 5(a), P is an insertion head for inserting a component m into a board Q, P' shows the position of the insertion head P at the time of insertion, and k and l are components which are already inserted. In this case, the component l interferes with the insertion head P at the position P' when the head P inserts the component m. FIG. 5(b) shows plain figures of a component region M of the component m, a component region K of the component k, a component region L of the component l, and an insertion operation space N of the component m. Possible interference is detected by checking the overlapped portion of these figures K through N. In this case, as the insertion operation space N of the component m and the component region L of the component l are overlapped with each other, the preceding relation of insertion order (Component m→Component l) is decided. It could be understood from FIG. 5, the dimensions of the insertion operation space N should be adjusted according to the heights of the components positioned around the space N. Accordingly, the dimensions of the insertion operation space N may be decided first by providing that all the components positioned among all the components used, so that the interference could be checked utilizing the decided space N. When overlapping is detected, the insertion operation space N should be made smaller according to the actual height of the component interfered with so that the overlapping could be checked again.

Although the shapes of the insertion operation space and the component regions are expressed as simple plain figures such as a rectangle, a circle, etc. in the above method so that the interference can be checked by detecting the overlapping of these figures, these shapes may be expressed as other figures or the combinations of figures. For example, the insertion operation space and the component regions may be expressed, respectively, as the combination of a rectangle and a circle, etc. Further, it is possible to express these space and regions, respectively, as a three-dimensional solid body such as a rectangular parallelepiped, a column, etc. and the combination thereof. These rather complicated figures are also effective to detect the interference by checking the overlapping thereof.

Next, the algorithm of the above mentioned overlap checking of the figures will be described in accordance with the embodiment in which the component regions are shown by rectangular or circular figures.

First, when all the component regions are shown by rectangular figures, one of rectangles is selected as a reference rectangle. Then, a rectangular region which is defined by two sides crossing at the lower left corner of the reference rectangle (including the reference rectangle) and a rectangular region which is defined by two sides crossing at the upper right corner of the reference rectangle (including the reference rectangle) are defined. If any other rectangle exists within any one of the rectangular regions, this rectangle overlaps with the reference rectangle.

When two component regions are shown by a rectangle and a circle, respectively, a region having the width corresponding to the radius of the circle is defined around the rectangle. If the center of the circle exists within the region including the rectangle, the rectangle and the circle overlap with each other.

When the component regions are shown by circles, these circles overlap with each other if the distance between centers of the circles is smaller than the sum of radiuses of both circles.

Figure 6:
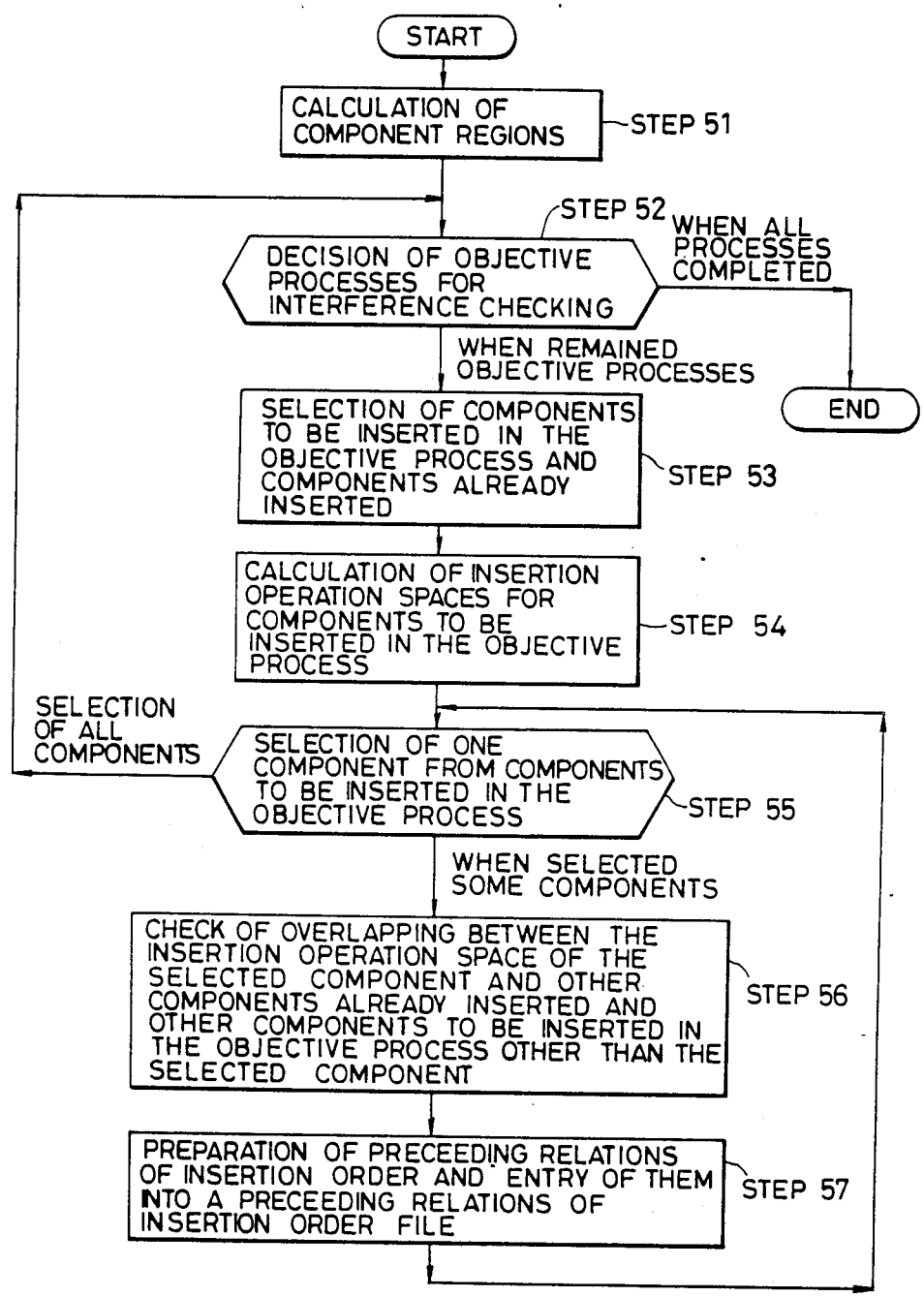
FIG. 6 is a flow chart showing the procedure for deciding preceding relations of insertion order according to the present invention.

FIG. 6 is a flow chart showing the procedure for deciding preceeding relations of insertion order (interference checking) according to the present method. This flowchart will be described relating to the processings performed in each step of the procedure.

(Step 51)

On the basis of the component size data 33 within the component information, the component regions are calculated for all components to be inserted which are listed in the assembly information.

(Step 52)

The preceding relations of insertion order are decided, in turn, for each machine or process, for example, in the order of an IC insertion machine, an axial lead component insertion machine, and so on. When the preceding relations of insertion order can be decided for all processes, all processings of this procedure are completed at this step.

(Step 53)

According to the contents of the insertion process data items 26 of the component records 20 in the assembly information, components to be inserted in an objective process (objective components) and components which are to be inserted in processes prior to the objective process (already inserted components) are selected for each objective process.

(Step 54)

The insertion operation spaces are obtained for all objective components.

(Step 55)

One component is selected from all the objective components. When all components are selected in this step, the procedure goes back to the step 52.

(Step 56)

The checking is performed for the overlapping between the insertion operation space of the component selected and the component regions of the components already inserted and the component regions of all other components than the selected component which are to be inserted in the objective process. In this step, a region around the board, and regions used by a board holder and a board loader are treated as insertion restricted regions in the same manner as the component regions of the already inserted component.

(Step 57)

The preceding relation of insertion order is obtained from the results of the step 56, which is entered into a preceding relation of insertion order file 48 on the disk storage. Then, the processing is returned to the step 55.

(3) Modification of insertion processes and insertion directions (Step 43)

Based upon the preceding relations of insertion order prepared by the above (2) (Step 42), the components which interfere with each other in any insertion order (uninsertable components) are selected so as to modify their insertion processes and insertion directions. This modification processing is executed for each process. The components are regarded as uninsertable in the following two cases:

(i) The case having the preceding relation of insertion order of Component i→Component j, in which the insertion process of the component j is carried out prior to the insertion process of the component i.

(ii) For the components to be inserted in the same process, the case having the conflicting preceding relations of insertion order such as Component i→Component j and Component j→Component i. When the components are more than three, the case having the preceding relations of insertion order such as Component k→Component l, Component l→Component m, and Component m→Component k.

The countermeasures for these cases are:
(a) Modification of an insertion process, and
(b) Modification of an insertion direction.

Supposing that there is the preceding relation of insertion order of Component i→Component j, and the insertion process of the component j is carried out prior to the insertion process of the component i, this preceding relation of insertion order can be satisfied by putting the insertion process of the component j next to the insertion process of the component i. Further, the preceding relation of insertion order of Component i→Component j may be eliminated by changing the insertion process of the component i, for example, to the manual assembly process, as the manual assembly process requires less space for inserting the component.

The modification of the insertion direction is also effective to satisfy the preceding relation of insertion order. Supposing that there is the preceding relation of insertion order of Component p→Component q, and that the component p has no polarity, it is possible to turn the component p in a 180-degree. This causes the insertion operation space of the component p to change, so that the preceding relation of insertion order of Component p→Component q may be eliminated.

Whichever modification method is used, the preceding relations of insertion order of the entire process are changed according to the modification. Thus, it is required to execute the step 42 (decision of preceding relation of insertion order) (interference checking) again.

In order to obtain the uninsertable component groups, which cause the interference in any insertion order, from the components to be inserted in the same process according to the preceding relations of insertion order prepared in the step (2), one solution utilizing graph theory will be described hereinafter.

Figure 7A:
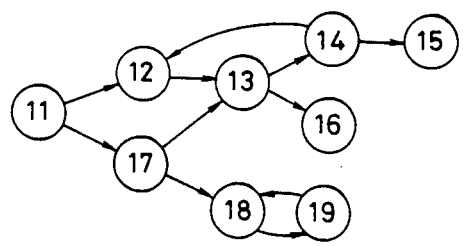
FIGS. 7(a) and (b) are directed graphs illustrating preceding relations of the insertion order according to the present invention.

In this solution, the preceding relations of insertion order are expressed by a directed graph, representing each insertion operation (a component to be inserted) as a vertex, and the preceding relations of insertion order as edges (directions shown by arrows). FIGS. 7(a) and (b) are directed graphs showing the preceding relations of insertion order according to the present invention. FIG. 7(a) shows the preceding relations of insertion order for nine kinds of components 11 through 19. In this graph, strongly connected components, that is, a collection of vertexes reachable with each other along the edge, constitute a group of uninsertable components. For example, the components 12, 13, and 14 constitute the uninsertable component group. The preceding relations of insertion order of these components can not be satisfied whatever order they may inserted. Similarly, components 18 and 19 constitute another uninsertable component group. Thus, it should be understood that the uninsertable component groups can be obtained readily by utilizing known graph theory.

Figure 7B:
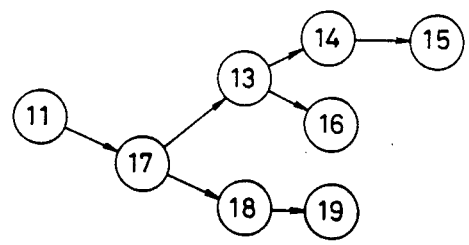

Accordingly, when all uninsertable component groups are eliminated by modifying insertion processes or insertion directions of the uninsertable components, the final preceding relations of the insertion order may be established. In FIG. 7(a), if the insertion process of the component 12 is put off and the insertion direction of the component 19 is changed, the preceding relations of insertion order of Component 11→Component 12, Component 12→Component 13, Component 14→Component 12, and Component 19→Component 18 are all eliminated. FIG. 7(b) shows the resultant final preceding relations of insertion order having at least one insertion order.

Further, according to the present method, the insertion processes and insertion directions of the components can be considered at the same time, so that the automatic insertion ratio can be further improved.

Next, the above method will be described in accordance with an actual example. In the example, an IC insertion machine and a RC insertion machine (for resistors, capacitors, etc.) are used in this order to insert fifteen components 1 through 15. FIG. 8 shows insertion process divisions 62 and insertable directions 63 for fifteen components 61, respectively, which are originally assigned to the components without considering the interference. The insertion process may be decided depending on the kind of the component such as IC, axial lead component, radial-lead component, etc. Further, the components are divided into two groups: one which can be inserted only in one direction, and the other which can be inserted in two directions (ordinary direction and reverse direction) depending on the component polarity, the component supplying direction, and the machine's insertable direction. Thus, it is important to select the insertion directions of the latter components which can be inserted in two directions so that the automatic insertion ratio is maximized.

In actual processings, it is necessary to take all combinatiins of the insertion directions into account for those components insertable in two directions. For example, when 50 components are insertable in two directions, the total number of the combinations of the insertion directions thereof is $2^{50} = 1.13 \times 10^{15}$. It is impossible, however, to calculate these great number of the combinations. Further, it is required to consider the insertion order of those components simultaneously.

In order to consider an insertion directions and the insertion order at the same time, it is necessary to obtain the preceeding relation of insertion order for each insertable direction of each component.

When the interference occurs in a specific insertion direction, this may be expressed, for example, by the following preceding relation of insertion order with the specific insertion direction II on an arrow:

$$\text{Component } i \xrightarrow{\text{II}} \text{Component } j.$$

This preceding relation of insertion order means that the insertion of the component i in the direction II causes the interference when the component j is already inserted, thus, the component i must be inserted prior to the component j when the component i is inserted in the direction II.

After all interference checkings have completed, a directed graph should be prepared, representing the components by vertexes, and the preceding relations of insertion order by edges, as shown in FIG. 9. Here, when the preceding relation of insertion order is generated between the components which are to be inserted by different machines such as $$\text{Component } 6 \xrightarrow{\text{IV}} \text{Component } 3$$

in FIG. 9, it should be considered that the preceding relation of insertion order in the reverse direction Component 3→Component 6 is also generated in order to add a condition relating to the order to use the insertion machines.

Further, in order to reduce the scale of the problem, the concept of strongly connected components of the graph theory is applied to this derected graph. The strongly connected components means the collection of vertexes reachable with each other along the edge. In the directed graph prepared on the basis of the preceding relations of insertion order, it should be understood that the strongly connected components constitute a component group in which components mutually play parts in generating the interference. Accordingly, the component groups which cause the interference can be readily detected by applying the method for calculating the strongly connected components. Further, it is possible to reduce the number of combinations to be calculated sharply by applying this method.

The existence of the strongly connected components indicates the possibility of the interference. Thus, the strongly connected components should be removed to avoid the interference. In order to remove the strongly connected components, it is required to remove either the preceding relation of insertion order or the component, which correspond to the selection of the insertion direction of the component insertable in two directions, or the modification of the insertion process (automatic insertion→manual insertion), respectively. Thus, the automatic insertion ratio will be a maximum when the insertion direction is selected so as to minimize the number of components whose insertion processes must be modified.

Figure 10:
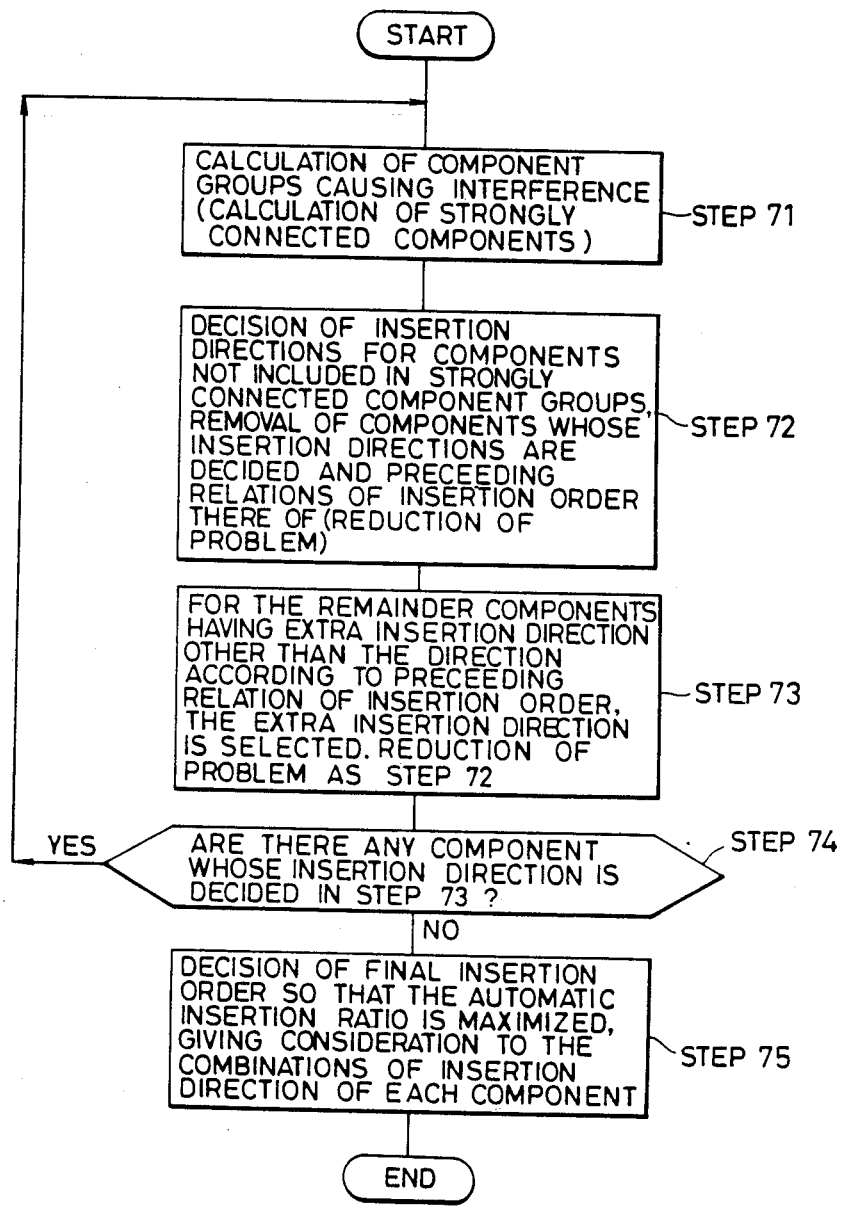
FIG. 10 is a flow chart showing the procedure for deciding insertion directions of the components according to the present invention.
Figure 11:
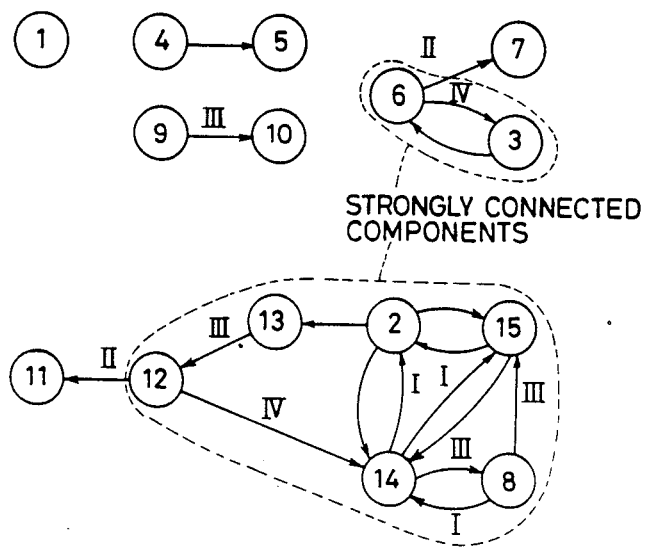
FIG. 11 through FIGS. 15(a), (b), (c), and (d) show the variation of directed graphs during processings of insertion directions according to the present method.

After the preparation of the directed graph is completed, the insertion directions of the components are now decided so that the automatic insertion ratio becomes a maximum according to the procedure shown in FIG. 10.

(1) Step 71

The strongly connected components are calculated in order to identify the component groups which participate in the generation of the interference.

(2) Step 72

For each component which is not included in the strongly connected component groups, it is possible to select an optional direction from insertable directions. These components and related preceding relations of insertion order are removed from the graph. (Reduction of the problem)

(3) Step 73

For each component having extra insertable direction in addition to the insertion directions based upon all the preceding relations of insertion order derived from the component, this extra insertion direction is selected in order to avoid the possibility of the interference. The components whose insertion directions are decided and their related preceding relations of insertion order are all removed from the graph.

(4) Step 74

If there are some components whose insertion directions are decided in the step 73, the processing is returned to the step 71. If there is no such component, the processing goes to the next step 75.

(5) Step 75

The insertion directions of the remaining components must be decided taking mutual relation into consideration. If the number of remaining components is small, the insertion directions of these components may be decided by selecting the solution so that the automatic insertion ratio will be maximum from all the combinations of the insertion directions of these components. Even when the number of remaining components are large, the solution can be obtained in a short time by utilizing a method such as the "branch and bound method" in the combinatorial problem.

After all the insertion directions of the components are thus decided, it is required to list the proceding relation of insertion order relating to the insertion direction decided for each component. Then, the insertion order should be decided so as to satisfy all the preceding relations of insertion order listed.

Figure 12:
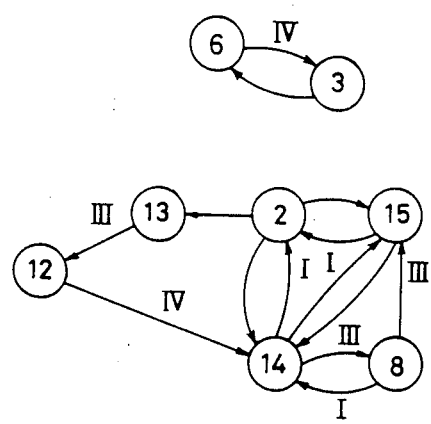

The above deciding method of the insertion processes and the insertion directions will now be described in accordance with the example. For the components shown in FIG. 9, two component groups (strongly connected component groups) [3, 6] and [2, 8, 12, 13, 14, 15] are obtained by performing the calculation of the step 71 shown in FIG. 10. These component groups participate in the interference. In the next step 72, the insertion directions are decided for the components 1, 4, 5, 7, 9 10 and 11 which are not included in the strongly connected component groups. These components whose insertion directions are decided and related preceding relations of insertion order thereof are removed from the directed graph of FIG. 9. FIG. 12 shows the resultant directed graph. In the step 73, the insertion direction of the component 6 is decided as II. This is because the component 6 is insertable in two directions II and IV, and the preceding relation of insertion order is generated only in the direction IV. Similarly, the insertion direction of the component 12 is decided as II.

Figure 13:
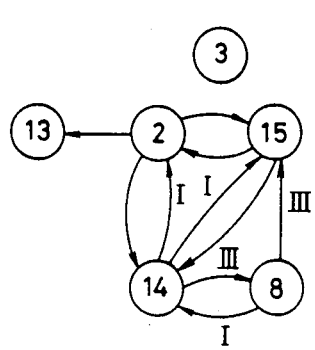

Then, the component 6 and 12 and their preceding relations of insertion order are removed from the graph as shown in FIG. 13.

Figure 14:
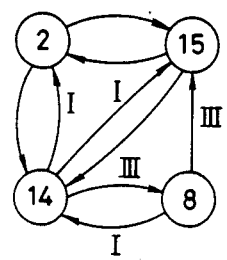
Figure 15A:
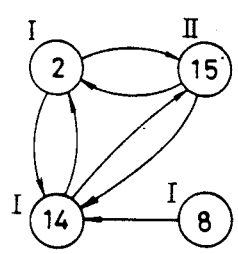
Figure 15B:
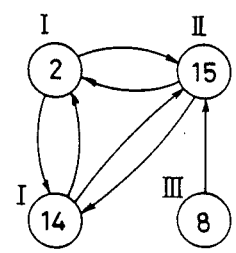
Figure 15C:
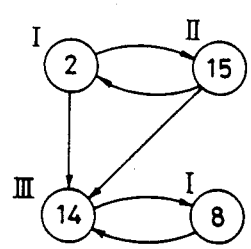
Figure 15D:
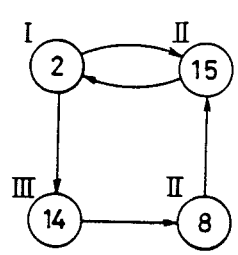

After that, the strongly connected component groups are calculated again based upon the resultant graph shown in FIG. 13 in the step 71. The strongly connected components are now [2, 8, 14, 15]. Accordingly, the insertion directions of the components 3 and 13 may be selected optionally from thier insertable directions, and they are removed from the graph. FIG. 14 shows the resultant directed graph.

Here, the calculation of the step 71 is executed again, but the strongly connected components 2, 8, 14, and 15 remain as they are. Thus, the insertion directions of these components must be decided so that the automatic insertion ratio becomes a maximum in the next step 75. In this example, since the component 2 is insertable only in the direction I, and the component 15 is insertable only in the direction II, the insertion directions of the components 2 and 15 are necessarily decided. On the other hand, since the components 8 and 14 are insertable in two directions I and III, four combinations are possible for their insertion directions. FIGS. 15(a) through (d) show these four combinations of the possible insertion directions of the components 8 and 14. In the combinations shown in FIGS. 15(a), (b) and (c), however, at least two components must be inserted manually. On the other hand in FIG. 15(d), the stringly connected component group is removed by shifting only the component 15 to the manual insertion. Accordingly, this is the optimal solution.

Figure 16:
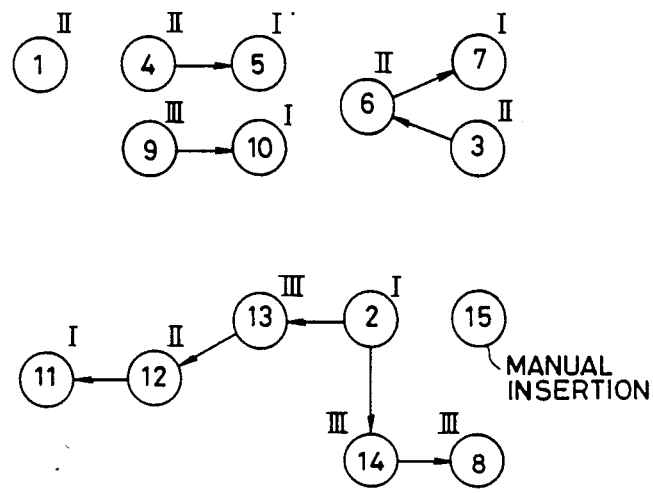
FIG. 16 shows preceding relations of insertion order prepared by the present method.

FIG. 16 shows the resultant insertion directions and the preceding relations of insertion order to be observed at the time when deciding the insertion order obtained by the present method.

According to the present method, it is possible to obtain the optimal solution to attain the maximum automatic insertion ratio, as the present method takes all combinations of all possible insertion directions for each component into consideration. Further in the present method, as the scale of the problem is reduced successively in course of the processings by the calculation of the strongly connected component groups and by the reduction of the problem, the optimal solution can be obtained in a short time.

In the above mentioned method, the objective function was the maximum automatic insertion ratio. However, since extra costs incurred by changing the insertion process to the manual insertion vary largely depending upon the kind of the components, it is effective, giving a cost for each component, to select the minimum total costs of the components which are shifted to the manual insertion as the objective function.

Figure 17:
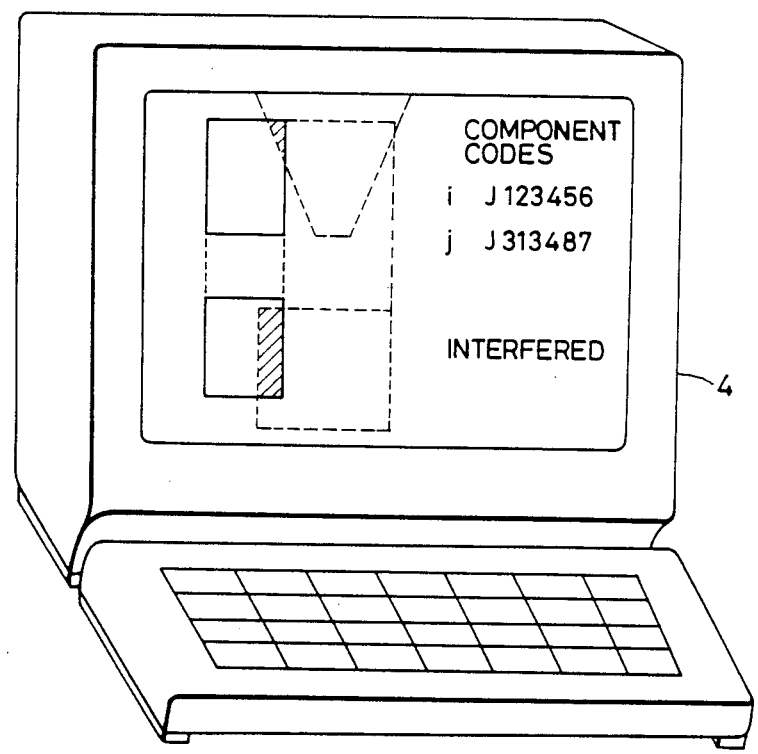
FIG. 17 shows a graphic display unit of the present invention displaying the positional relation between components on a board and an insertion head of a component insertion machine.

Further, the insertion processes and the insertion directions may be decided interactively on the basis of a designer's judgement. FIG. 17 shows the graphic display unit 4 of the present invention displaying the position and shape of the insertion head of an insertion machine at the time when inserting a component i and the position and shape of the component i thereon. The interfered portions (shadowed portions) are recognized readily by this display, thus, a designer may easily decide the insertion processes and insertion directions.

The present method is extremely effective for the following cases.

In the case where radial lead components such as film capacitors, plate resistances, etc. are inserted by an insertion machine, some of these radial lead components are allowed to be deformed by an insertion head of the insertion machine after they are inserted in places. For example, when another component is inserted just after the film capacitor has been inserted, the insertion head of the insertion machine may insert this component pushing the film capacitor aside. If the flexing of the film capacitor at that time is small, this causes no problem.

Accordingly, if the degree of the interference (sizes, shapes, etc. of the interfered portions) may be displayed on the graphic display unit 4 of the present invention as shown in FIG. 17, designers can judge whether the component is insertable or not on the basis of concrete sizes of the components on the display.

By this method, the graphic display unit 4 displays the positional relation and the degree of the interference between the components which interfere and the insertion head of the insertion machine. Thus, it is possible to increase the number of automatically insertable components by modifying the results of the interference checking taking errors in modelling (generally modelling is performed on the safety side, that is, on the larger side) and deformation of the film capacitor into account.

(4) Decision of insertion order (Step 44)

After the final preceding relations of insertion order are decided in the step (3), there always exists at least one insertion order by which the components can be inserted in the objective process satisfying these constraints. Among the possible insertion orders, one optimal insertion order is selected in this step.

The optimal insertion order means the insertion order by which the final preceding relations of insertion order are satisfied and the total insertion time of components is minimized. The insertion order should be selected, in turn, for each insertion machine.

The insertion time of components includes time required for inserting components, waiting time from the end of the insertion of a component i to the start of the next insertion of a component j, time for shifting a board from its set position in an insertion machine to the start position, and time for shifting the board from the end position after all components are inserted and removing it from the machine. Among them, only the waiting time varies its value depending on the insertion order. Thus, a cost matrix is prepared utilizing the waiting time of the component j as the (i, j) element, providing that the component j is inserted next to the component i.

The cost is determined considering the following items (i) through (iv).

(i) Waiting Time for Supplying Components

Except for the case in which components to be inserted are supplied according to the insertion order by utilizing a sequencer, etc., it is generally inevitable for waiting time to be generated for supplying components when different kinds of components are inserted successively.

(ii) Waiting Time for Shifting

According to the positional relationship between two components to be inserted successively, the waiting time is necessarily generated for shifting an insertion machine head or a board.

(iii) Waiting Time for Rotation

When the insertion directions of two components to be inserted successively differ from each other, a waiting time is generated to rotate an insertion machine head or a board.

(iv) Waiting Time for Changing Pitches

When pitches (dimensions) of components to be inserted successively differ from each other, the waiting time is generated for changing pitches of an insertion head.

These four kinds of waiting time are calculated for every combination of two components. It depends greatly upon each insertion machine how each waiting time is reflected in the cost of processing. However, the cost can be obtained generally by either one of the following equations:

Cost = max (Waiting time for supplying components,

Waiting time for shifting, Waiting time for rotations,

Waiting time for changing pitches)

or

Cost = Waiting time for rotation + max (Waiting time for supplying components,

Waiting time for shifting,

Waiting time for changing pitches)

From the above information, it is possible to obtain the insertion order by which no interference is generated by utilizing the present method.

Figures 18A, 18B, 18C:
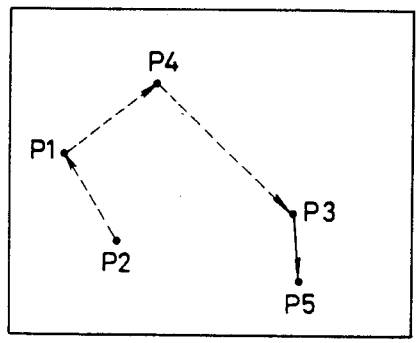
FIGS. 18(a), (b), and (c) show an example procedure for deciding insertion order of components according to the present invention.

Providing that a cost matrix shown in FIG. 18(b) is given for components P1 through P5, and preceding relations of insertion order of P2→P5, P2→P1, and P1→P3 are prepared as shown in FIG. 18(c) for the components P1 through P5, the insertion order to minimize the total cost is P4→P1→P2→P3→P5, and the cost amounts to "58". Since this insertion order, however, does not satisfy the preceding relation of insertion order P2→P1, it is apparent that this order can not be the solution. In this example, the optimal insertion order is given as P2→P1→P4→P3→P5 by which the total cost comes to "66", and this is the samllest among the solutions satisfying the preceding relations of insertion order of these components.

When the number of components to be inserted is small as in the above example, it is suitable to use a "perfect enumeration method" which calculates all possible insertion orders and selects the optimal one which minimizes the total cost from the insertion orders satisfying the preceding relations of insertion order given. When the number N of components is large, however, the perfect enumeration method is not practical since the number of possible insertion orders N! increases remarkably.

Further, it is well known that, as a method for calculating the optimal insertion order of such a large number of components, the solution of "travelling salesman problem" has been often utilized. But, the constraints based upon the preceding relations of insertion order of the present method can not be introduced to this method, and it is not applicable to the present case.

Figure 19A:
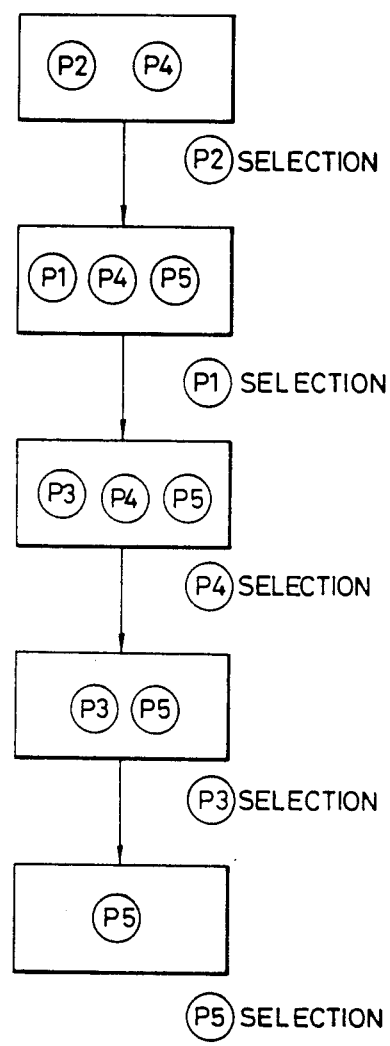
FIGS. 19(a) and (b) show collections of insertable components and constraints for each stage according to the present invention.
Figure 19B:
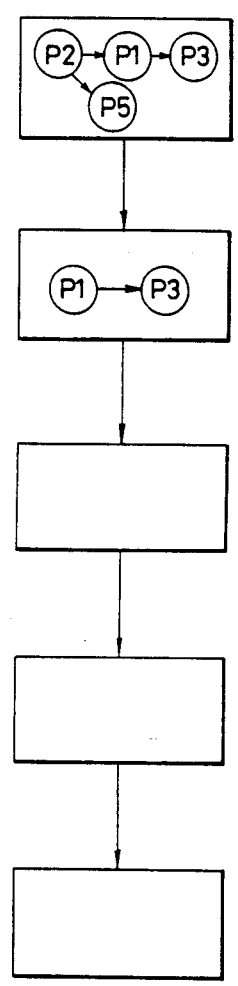

In the method according to the present example, the constraints relating to the insertion orders of the components are illustrated by a directed graph, as shown in FIG. 20, in which the components are represented by vertexes of the graph, and the constraints are represented by the edges (→). FIG. 19(a) shows a collection of the components which is selectable for next insertion in each step, and FIG. 19(b) shows the preceding relations of insertion order in each step. In this example, the components which are selectable as the first component to be inserted are P2 and P4, and P2 is selected from this collection as the first component. The preceding relations of insertion order P2→P1 and P2→P5 are eliminated by this selection, and the components P1 and P5 are added to the next collection of the insertable components. After that, the components P1, P4, P3, and P5 are selected successively. In result, the insertion order P2→P1→P4→P3→P5 satisfies the preceding relations of insertion order given, and minimizes the total cost. Although the optimal solution is casually obtained in this example, it should be understood that the optimal solution is not always obtained in this method.

In order to increase the accuracy of the solution, the following method may be further applied. First, a small positive integer n is taken, then, the insertion order of successive n number of components is calculated.

Supposing that the i-th component P(0) is already decided, the next (i+1)-th component is obtained by:

(1) Selecting the component P(1) which is closest (this minimizes the cost) to P(0) from the next collection of the insertable components.

(2) Removing P(1) from the next collection of the insertable components, and adding the components whose preceding relations of insertion order are eliminated by the selection of P(1) to the next collection of the insertable components.

(3) Selecting the component P(2) which is closest to P(0) from the next collection of the insertable components.

(4) Selecting n number of components successively in order from closest one to P(0).

(5) Selecting the insertion orders satisfying the preceeding relations of insertion order for the components P(0) through P(n), then, selecting the optimal one which minimizes the cost from the insertion orders selected.

(6) Providing that the second component to be inserted next to P(0) in the insertion order selected in the step (5) is P(k), P(k) is the (i+1)-th component to be inserted in the optimal insertion order.

The optimal insertion order of all the components can be obtained by repeating the above steps (1) through (6) successively.

Figures 20A, 20B, 20C:
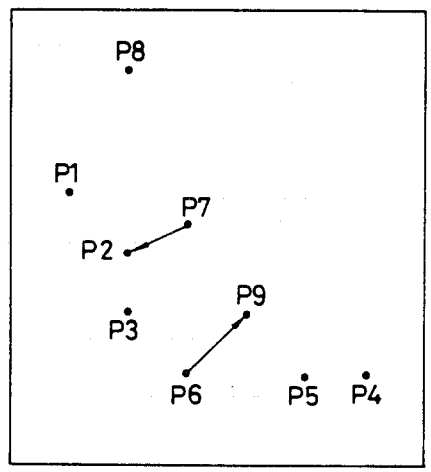
FIGS. 20(a), (b), and (c) show an example procedure for deciding insertion order of components according to the present invention.

This method will be described concretely in accordance with the example shown in FIG. 20. In this example, nine components P1 through P9 are to be inserted as shown in FIG. 20(a), and the given preceding relations of insertion order P7→P2 and P6→P9 as shown in FIG. 20(c). The first component to be inserted is P1, and n=4. Further, a cost matrix is given as shown in FIG. 20(b).

Four components are selected in turn from a collection of insertable components in the order from the closest one to P1. That is, the collection of insertable components in this step is [P3, P4, P5, P6, P7, P8], and the closest component to P1 is P7, thus, P7 is selected first. P7 is then removed from the collection of insertable components, and P2 is added to the collection. As a result, the collection includes [P2, P3, P4, P5, P6, P8].

Next, the closest component to P1 is now P2 which is selected as the second component. By repeating these processings, four components P2, P3, P7, and P8 are selected. As the starting component is provided as P1, there are 24 possible insertion orders for these four components. Among them, the insertion order P1→P8→P7→P2→P3 is optimal, as it satisfies the preceding relations of insertion order given and minimizes the cost. Accordingly, the second component to be inserted is P8.

Then, the third component must be selected based upon the insertion order starting from the component P8. Four components selected in this step are P2, P3, P6 and P7, and the optimal insertion order with the minimum cost is P8→P7→P2→P3→P6. Thus, the third component is P7 which is to be inserted next to P8.

Figure 21:
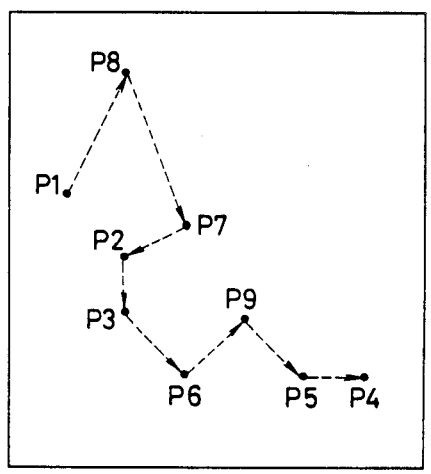
FIG. 21 and FIG. 22 show insertion orders decided by different approaches according to the present invention.

Repeating the processings as the above, the final insertion order is obtained as P1→P8→P7→P2→P3→P6→P9→P5→P4 as shown in FIG. 21.

Figure 22:
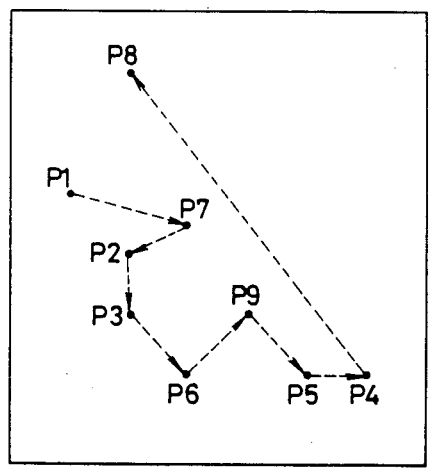

When the same example is solved by the former method (in which n=1), the insertion order is obtained as P1→P7→P2→P3→P6→P9→P5→P4→P8 as shown in FIG. 22. Accordingly, it is apparent that the later method (in which n=4) is superior. In this example, the latter method reduces the total cost more than 20%.

It should be understood from the description for the step (5) that the larger the number n the larger the number of paths which satisfy the constraints. Thus, preferably the number n is 8 at most.

This method is applicable to the case having isolated points. Further, this method is also effective for the case dealing with more than 500 components, providing the solution in a short time.

(5) Preparation of NC Data for Inserting Components (Step 45)

Since the insertion processes and the insertion order of the components are already decided in the above (3) (Step 43) and (4) (step 44), respectively, NC data for inserting components can be prepared readily according to them for each insertion machine by the known technique.

As described above, NC data for inserting components can be prepared in a short time by utilizing a computer system of the present invention, taking account of possible mechanical interference between an insertion head of an insertion machine and components already inserted. Accordingly, the present invention is very laborsaving and timesaving in preparing NC data, requires no data check while operating an insertion machine, and reduces insertion errors.

Further, insertion processes and insertion directions of components are determined automatically in the present invention so that an automatic insertion ratio becomes a maximum, thereby minimizing the number of components shifted to the manual insertion which requires much more operation time than the automatic insertion. Thus, the present invention reduces the total operation time required for inserting all components into a printed board. The total operation time can be further reduced by optimizing the insertion order.

Accordingly, the present invention is very effective in reducing manhours required both for preparing NC data and for actual operation.

We claim:

1. An apparatus for preparing numerical control data for inserting components comprising:

a storage means for storing assembly information including a board information record and component records as many as the number of components to be inserted into a board, and component information relating to components to be used, for an individual board;

an input means for entering the assembly information and the component information;

a display means for displaying results of processings;

an output means for outputting the numerical control data prepared; and a processor means for preparing the numerical control data by, at first, provisionally deciding insertion processes on a basis of said assembly information and the component information, then, checking possible mechanical interference, when inserting the component, between an insertion head and other components to be inserted by prior insertion machines and by the same insertion machine, after that, preparing preceding relations of insertion order according to the results of the interference checking, then, deciding insertion order according to the preceding relations of insertion order, and finally, preparing said numerical control data for automatically inserting said components.

2. A method for preparing numerical control data which are required by an insertion machine for controlling automatic insertion of components by utilizing a computer system comprising the steps of:

provisionally determining insertion processes of the components to be inserted into a board on the basis of prestored assembly information having a component name and its insertion position and component information having a component name, its insertion process division and its component size thereof;

checking possible mechanical interference, at the time when inserting a present component, between an insertion head of the insertion machine and other components having a possibility to be inserted prior to the insertion of the present component so as to prepare preceding relations of insertion order according to the result of checking possible mechanical interference;

selecting components which cannot possibly be automatically inserted according to the preceding relations of the prepared insertion order, and modifying insertion processes or insertion directions of these components;

determining the insertion order of the components; and preparing numerical control data for inserting said components automatically according to the insertion processes and the insertion order decided.

3. A method according to claim 2, wherein the step of determining the insertion processes provisionally comprises the step of searching said component information utilizing the component name in said assembly information as a key, and determining each insertion process provisionally according to the insertion process division assigned to the component.

4. A method according to claim 2, wherein the step of checking mechanical interference comprises the steps:

calculating a region required for an insertion of a component by an insertion head of the automatic insertion machine when inserting the component and regions to be occupied by the components having the possibility to be inserted prior to the component, as simple plain figures; and checking the overlapping of these figures.

5. A method according to claim 2, wherein the step of checking mechanical interference comprises the steps:

calculating component regions for all the components to be inserted that are stored within the assembly information on the basis of component size data stored in the component information;

determining objective processes of the interference checking in turn;

selecting the components to be inserted in the objective process and the components to be inserted in the processes prior to the objective process;

calculating insertion operation spaces for all the components to be inserted in the objective process;

selecting one component from the components to be inserted in the objective process;

checking the overlapping between the insertion operation space of the selected component and the regions of the components to be inserted in the processes prior to the objective process and to be inserted in the objective process other than the selected component; and calculating the preceding relations of insertion order according to the checking of overlap and entering them into preceding relations of an insertion order file.

6. A method according to claim 2, wherein the step of selecting the components which are not possible to be automatically inserted and modifying the insertion processes or the insertion directions comprises the steps:

expressing the preceding relations of insertion order in a directed graph, representing each component as a vertex and the preceding relation of insertion order as an edge, and calculating strongly connected components so as to obtain component groups which participate in the interference; and calculating, for the components which are included in the strongly connected components and which are insertable in another insertion direction other than a direction presently considered, the component groups which participate in the interference when inserted in the other insertion direction, then, releasing these component groups so as to reduce the possibility of the occurrence of the interference, and when there remain some components which participate in the interference in spite of said processings, modifying the insertion processes thereof until there remain no components which participate in the interference so as to avoid the occurrence of the interference.

7. A method according to claim 2, wherein the step of selecting the components which are not possible to be automatically inserted and modifying the insertion processes or the insertion directions comprises the step of displaying the position and shape of the insertion head of the insertion machine, and the positions and shapes of the components on a graphic display unit.

8. A method according to claim 2, wherein the step of selecting the components which are not possible to be automatically inserted and modifying the insertion processes or the insertion directions comprises the steps:

calculating constraints relating to the insertion order between the components in order to avoid the occurrence of the interference by checking the possible interference between the insertion head and other components when inserting the component in all possible directions by the automatic insertion machine for each component;

calculating the component groups which participate in the occurrence of the interference on a basis of these constraints;

selecting the component which can be removed from the component groups which participate in the occurrence of the interference when the insertion direction is specified, and calculating again the component groups which participate in the occurrence of the interference utilizing the insertion direction specified as that of the component selected; and selecting, for the remaining components within the component groups which participate in the occurrence of the interference, the insertion direction for each component from the combination of the insertable directions of each component so that the number of the components which cannot be inserted automatically is minimized.

9. A method according to claim 2, wherein the step for deciding the insertion order comprises the steps:

selecting a first component from a collection of the components satisfying constraints based upon the preceding relations of insertion order of the components, and removing the first component from the collection; and adding the components satisfying the constraints based upon the remaining preceding relations of insertion order by removing the preceding relations of insertion order concerning the first component to the collection, selecting a component closest to the first component as a second component, removing the second component from the collection and determining the insertion order of the components by repeating these steps, selecting the components one after another.

* * * * *